(12) United States Patent
Shibata (10) Patent No.: US 6,437,482 B1
(45) Date of Patent: Aug. 20, 2002

(54) PIEZOELECTRIC RESONATOR

(75) Inventor: Akihiko Shibata, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/547,193

(22) Filed: Apr. 11, 2000

(30) Foreign Application Priority Data

Apr. 19, 1999 (JP) .......................................... 11-111299

(51) Int. Cl.$^7$ ............................................. H01L 41/04
(52) U.S. Cl. ...................................... 310/320; 310/330
(58) Field of Search ............................... 310/320, 324, 310/357, 330, 331, 332

(56) References Cited

U.S. PATENT DOCUMENTS

| | | | |
|---|---|---|---|
| 3,590,287 A | 6/1971 | Berlincourt et al. | 310/8.2 |
| 4,456,850 A | * 6/1984 | Inoue et al. | 310/324 |
| 4,642,508 A | * 2/1987 | Suzuki et al. | 310/321 |
| 5,075,641 A | * 12/1991 | Weber et al. | 331/108 C |
| 5,231,327 A | 7/1993 | Ketcham | 29/25.35 |
| 5,404,628 A | 4/1995 | Ketcham | 310/320 |
| 5,587,620 A | * 12/1996 | Ruby et al. | 310/346 |
| 5,873,153 A | * 2/1999 | Ruby et al. | 29/25.35 |
| 6,140,740 A | * 10/2000 | Porat et al. | 310/322 |

FOREIGN PATENT DOCUMENTS

| | | |
|---|---|---|
| EP | 0771070 | 5/1997 |
| JP | 63067910 | 3/1988 |

OTHER PUBLICATIONS

Korean Examination Report dated Dec. 20, 2001, along with an English translation.

* cited by examiner

Primary Examiner—Tran Nguyen
Assistant Examiner—Peter Medley
(74) Attorney, Agent, or Firm—Ostrolenk, Faber, Gerb & Soffen, LLP (57) ABSTRACT

A piezoelectric resonator using a thickness extensional vibration mode, comprises a vibrator portion made up of two or more layers of piezoelectric thin-films where the piezoelectric thin-films and a plurality of insulating thin films are alternately laminated. An alternating voltage is independently applied to each layer of the piezoelectric thin-films for a higher-order vibration mode to be dominantly excited.

35 Claims, 6 Drawing Sheets

LOCATION IN THICKNESS DIRECTION OF PIEZOELECTRIC RESONATOR [μm]

FIG. 8

FREQUENCY [MHz]

PIEZOELECTRIC RESONATOR

BACKGROUND OF THE INVENTION

1. Field of the Invention

The present invention relates to a multilayer piezoelectric resonator making use of a higher-order vibration mode which is to be used, for example, in an oscillator, filter, etc.

2. Description of the Related Art

Figure 1:
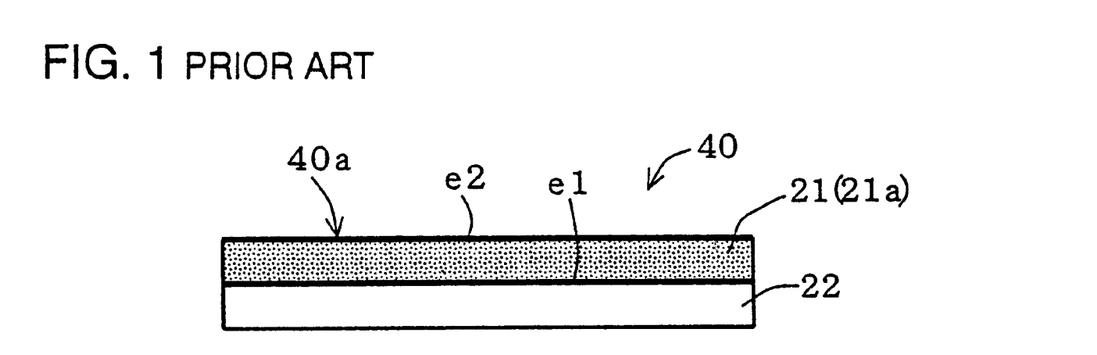
FIG. 1 shows the construction of a conventional piezoelectric resonator.
Figure 2:
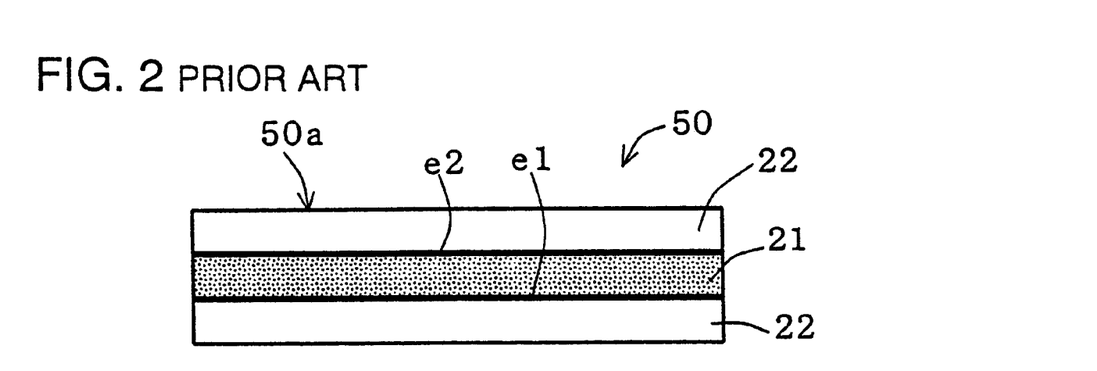
FIG. 2 shows the construction of another conventional piezoelectric resonator.

A conventional piezoelectric resonator 40 using a thickness extensional vibration mode is shown in FIG. 1. In this piezoelectric resonator, a vibrator portion 40a is formed by a piezoelectric thin-film layer 21 (having thin-film electrodes e1 and e2 laminated on opposite sides of a piezoelectric thin film 21a) and an insulating thin film layer 22. Another conventional piezoelectric resonator is shown in FIG. 2. In this resonator 50, a vibrator portion 50a is formed by laminating an insulating thin film layer 22, a piezoelectric thin-film layer 21, and an insulating thin film layer 22. As used herein, the term "thin-film" refers to films having a thickness in the range of about 0.01 to 100 µm.

In the conventional piezoelectric resonators 40 and 50, large electro-mechanical coupling coefficients are obtained only in the relatively lower-order vibration modes such as the fundamental mode, second mode (second harmonic mode), etc. of the thickness extensional vibration mode. Therefore, when high resonance frequencies are desired, the thickness of the vibrator portions 40a and 50a must be reduced because the resonance frequencies are inversely proportional to the thickness of the vibrator portions 40a and 50a. For example, in the piezoelectric resonator 40 of FIG. 1, when zinc oxide (ZnO) is used for the piezoelectric thin film 21a, the thickness of the vibrator portion 40a must be made as thin as about 4.7 µm in order to realize a resonance frequency of 650 MHz. As a result, the mechanical strength of the vibrator portion 40a decreases and the vibrator portion 40a becomes easily damaged. Further, in the conventional piezoelectric resonators 40 and 50, because the ratio of the thickness of the thin-film electrodes e2 and e2 to the thickness of the vibrator portions 40a and 50a increases, there is also a problem that the damping is increased and the mechanical Q of the resonance is reduced.

SUMMARY OF THE INVENTION

The present invention provides a piezoelectric resonator which can effectively operate in a higher-order vibration mode with a high resonance frequency while maintaining the mechanical strength of the vibrator portion.

According to a first aspect of the invention, a piezoelectric resonator using a thickness extensional vibration mode comprises a vibrator portion made up of n layers of piezoelectric thin-film, n being an integer greater of equal to 2, each of the piezoelectric thin-film layers being separated by a respective insulating thin-film layer, the distance d of the nth piezoelectric thin-film layer from a first side of the vibrator portion, being determined by the formula $$d = t(2m-1)/2n$$

wherein t is the thickness of the vibrator portion and m is an integer less than or equal to n.

According to a second aspect of the invention, the piezoelectric resonator is used in conjunction with a voltage source, the combination comprising:

a piezoelectric resonator using a thickness extensional vibration mode, the piezoelectric resonator comprising a vibrator portion made up of n layers of piezoelectric thin-film, n being an integer greater of equal to 2, each of the piezoelectric thin-film layers being separated by a respective insulating thin-film layer; and a voltage source for applying alternating voltages to the piezoelectric resonator in such a manner that the predominant vibration mode excited in the piezoelectric resonator is a higher-order vibration mode.

According to a third aspect of the invention, the invention comprises a method for exciting a piezoelectric resonator in a thickness extensional vibration mode, the piezoelectric resonator comprising a vibrator portion made up of n layers of piezoelectric thin-film, n being an integer greater of equal to 2, each of the piezoelectric thin-film layers being separated by a respective insulating thin-film layer, the method comprising:

applying alternating voltages to the piezoelectric thin film layers in such a manner that the predominant vibration mode excited in the piezoelectric resonator.

In all three aspects of the invention, the vibrator portion preferably has a thickness t equal to half the first (basic) resonance wavelength of a thickness extensional vibration mode of the resonator. The resonator is excited in a nth (second or higher) higher-order vibration mode by applying appropriate alternating voltages to the piezoelectric thin-film layer. Particularly, the alternating voltages are applied in such a manner that the vibrations induced in adjacent piezoelectric thin-film layers are opposite in phase. This can be done, for example, by applying alternating voltages of opposite phase to the adjacent piezoelectric thin-film layers when the polarization direction of those layers is the same. Alternatively, alternating voltages of the same phase can be applied to adjacent piezoelectric thin film layers when the polarization direction of those layers is opposite to one another.

Each of the piezoelectric thin-film layers is preferably formed at a respective nodal point of the nth higher-order vibration mode. As a result, the first (basic) vibration mode or lower-order vibration modes lower than the nth mode disappear or attenuate by canceling each other due to the interference of opposite phase mechanical vibrations of the piezoelectric thin-film layers, and only the nth higher-order vibration mode is predominantly excited. As a result, the electro-mechanical coupling coefficient of the piezoelectric resonator is large and a sharp resonance curve can be obtained.

Further, because the thickness t of vibrator portion) is equal to one half of the resonance wavelength of the basic vibration mode, high resonance frequencies of short wavelengths can be obtained for a given thickness of the vibrator portion. This makes it possible to produce vibrations having higher frequencies without degrading the strength of the vibrator portion.

The piezoelectric thin-films and insulating thin film layers are preferably composed of materials where the temperature coefficient of the elastic constants is of opposite sign. As a result, the temperature coefficient of the elastic constants of the piezoelectric thin-film layers and insulating thin film layers offset one another, thereby stabilizing the frequency-temperature characteristics of the piezoelectric portion For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 3:
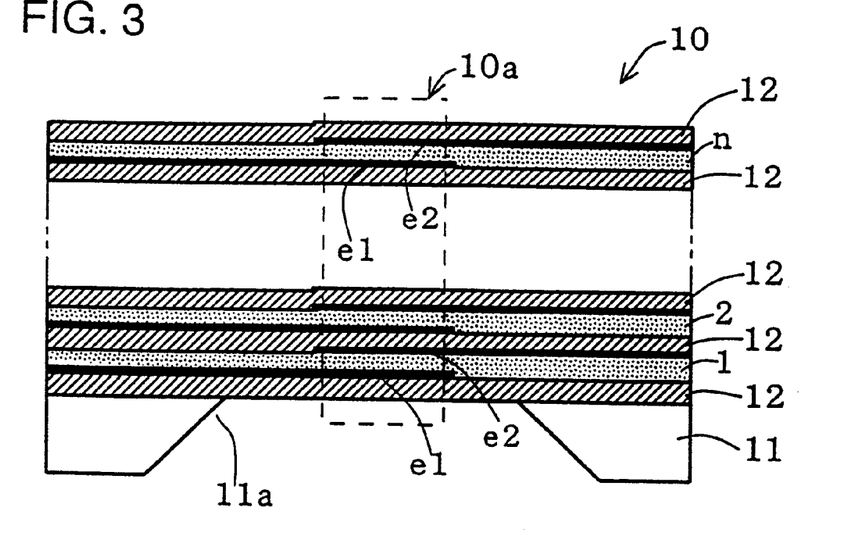
FIG. 3 is a longitudinal sectional view of the construction of a piezoelectric resonator of an embodiment of the present invention.

A piezoelectric resonator 10 of an embodiment of the present invention is described with reference to FIG. 3. In this embodiment, a silicon supporting substrate 11 has n+1 layers (n being an integer greater than or equal to 2) of silicon oxide ($SiO_2$) film 12 and n layers of piezoelectric thin-film 1 through n formed thereon. Thin-film electrodes e1 and e2 are formed respectively on opposite surfaces of each piezoelectric thin-film layer. Once the layers of thin films have been formed on substrate 11, a hole 11a is formed in the substrate.

The piezoelectric resonator 10 of this multilayer construction is preferably formed by appropriately using thin-film deposition techniques such as sputtering, chemical vapor deposition, vacuum evaporation, etc. and photo etching techniques. The process is initiated by providing a silicon substrate (a master substrate formed of the supporting material 11). An insulating thin film 12 is deposited on the top surface of the substrate 11. An electrode thin film such as copper, aluminum, gold/chromium, etc. is then deposited on that layer to form a thin-film electrode e1 of an appropriate shape. A piezoelectric thin film composed of piezoelectric materials such as zinc oxide (ZnO), lead titanate zirconate, etc. is deposited on the electrode e1 and the exposed portion of the lower insulating thin film 12. An electrode thin film is deposited on the piezoelectric thin film and is appropriately patterned to form a thin-film electrode e2. In the central portion of the piezoelectric thin film, the thin-film electrode e1 (as a lower-layer) and the thin-film electrode e2 (as an upper-layer) overlap one another through the piezoelectric thin film so as to form a piezoelectric thin-film layer 1. This process is repeated for each of the n piezoelectric thin-film layers so that a multilayer construction composed of (n+1) layers of insulating thin films 12 and n layers of piezoelectric thin-films is formed. Each layer of piezoelectric thin-film layers is insulated from its neighboring piezoelectric thin-film layer by the insulating thin film layer 12 located between them. The hole 11a is formed by through-etching the central portion of the silicon substrate support 11. Because of the presence of this hole 11a, the portion where each layer of the thin-film electrodes e1 and e2 overlie one upon another constitutes a vibration portion 10a. Furthermore, the thin-film electrodes e1 and e2 of each layer extend to the outer periphery of the piezoelectric resonator 10, although this is not illustrated.

Figure 4:
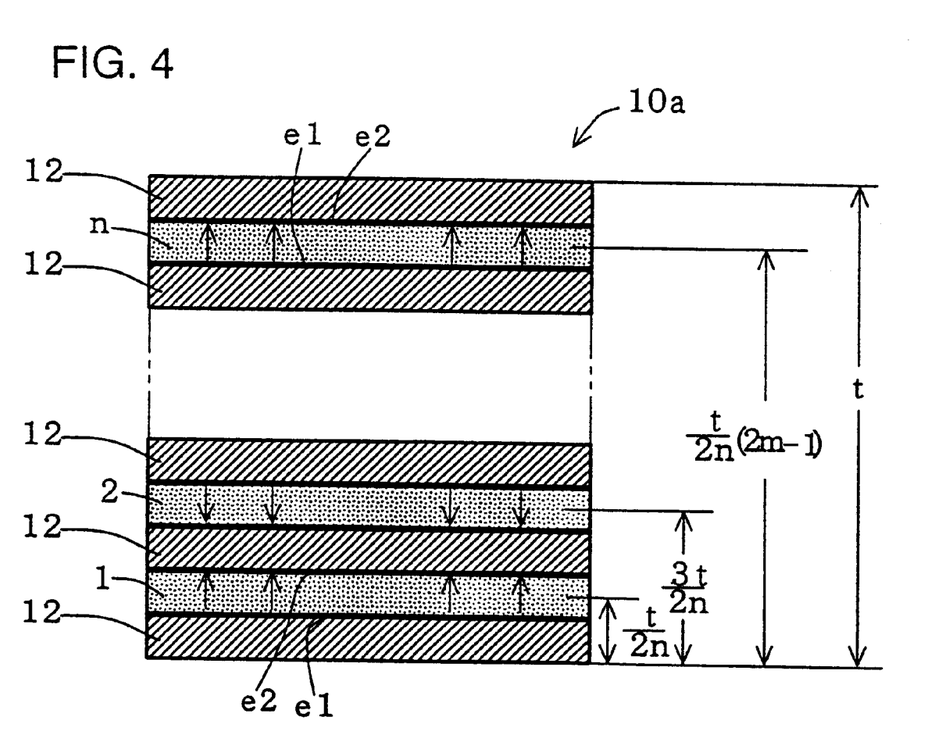
FIG. 4 is an expanded longitudinal sectional view of the vibrator portion of the piezoelectric resonator shown in FIG. 3.

The preferred arrangement of the piezoelectric thin-films 1 through n is determined as shown in FIG. 4. The vibrator portion 10a is made to vibrate at an $n^{th}$ higher-order mode and is made up of n piezoelectric thin-film layers 1 through n. Each piezoelectric thin-film layer is located at a respective distance d from one side (the lower side in FIG. 1) of the vibrator portion 10a as measured in the thickness direction thereof. Distance d is given by the following formula, and corresponds to the nodal point of the nth vibration of the piezoelectric resonator or its vicinity:

$$d = t(2m-1)/2n$$

where t represents a thickness of vibrator portion 10a, m is an integer indicating the sequential number of the piezoelectric thin film at issue, $m \leq n$ (i.e., m=1, 2, 3, ... n), and n>2.

In accordance with this formula, the center of the first piezoelectric thin-film layer 1 is located at a distance d=t/2n (m=1) from the bottom of vibrator portion 10a. The second piezoelectric thin-film 2 is located at a distance d=3t/2n (m=2) from the bottom of vibrator portion 10a. The nth piezoelectric thin-film n is located at a distance d=t(2n−1)/2n (m=n).

Neighboring piezoelectric thin-film layers 1 through n are preferably arranged so that the orientation axis (the C axis) is in the thickness direction of the vibrator portion 10a when the piezoelectric materials zinc oxide. In the case of lead titanate zirconate, etc., the polarization direction is made in the thickness direction.

The polarization directions of adjacent piezoelectric thin-film layers 1 through n are selected such that they are polarized either in the same direction or in opposite directions from one another. In the case where adjacent piezoelectric thin-film layers 1 through n are polarized in the same direction, voltages are applied to adjacent piezoelectric thin-films 1 through n with opposite phases as each other. In the case where adjacent piezoelectric thin-films 1 through n are polarized in the opposite direction, voltages are applied to adjacent piezoelectric thin-films 1 through n with the same phase as each other. In both cases, the adjacent piezoelectric thin-films 1 through n are excited in opposite phases.

It is desirable to use materials for the piezoelectric thin-films which have temperature coefficient of the elastic constant which are opposite to one another. For example, different materials of positive and negative temperature coefficients as in a group of ZnO (−161 ppm/° C.), LiNbO$_3$ (−153 ppm/° C.), and quartz (−188 ppm/° C.) on the one hand and a group of SiO$_2$ (+239 ppm/° C.) and AlN(+100 ppm/° C.) on the other. By doing so, the temperature characteristics of the frequency of the piezoelectric resonator is stabilized.

When the piezoelectric resonator is made to, as shown in FIG. 4, the resonator is excited at a nth mode by applying voltages to the piezoelectric thin-films 1 through n as explained above. Thus, by arranging the piezoelectric thin-film layers 1 through n at the nodal points of the vibration and exciting the neighboring piezoelectric thin-film layers 1 through n in opposite phase, it is possible to increase the electro-mechanical coupling coefficient at the nth higher-order vibration mode and strongly excite the nth higher-order vibration mode.

Figure 5:
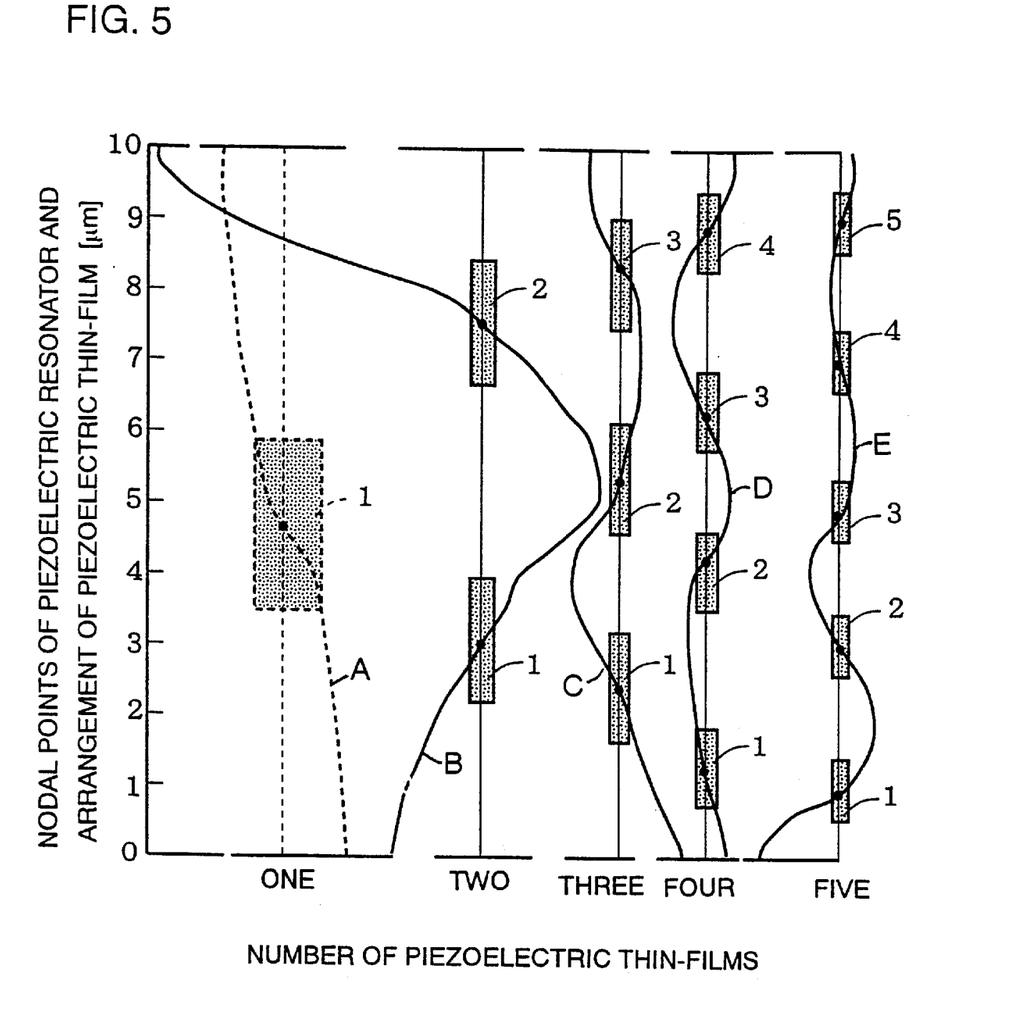
FIG. 5 shows the relationship between the nodal points of multilayer piezoelectric resonators and the arrangement of piezoelectric thin-films.

FIG. 5 shows simulated waveforms of the piezoelectric resonator (determined by a basic piezoelectric formula) when the multilayer piezoelectric thin-films are spaced in accordance with the above formula [d=t(2m−1)/2n]. As can be seen from this graph, the location of each piezoelectric thin-film layer is close to the nodal points of the simulation waveform. Waveform A shows the first (basic) vibration mode of a conventional piezoelectric resonator composed of one layer of piezoelectric thin-film 1. Waveforms B through E show the second through fifth higher-order vibration modes in the piezoelectric resonator according to the present invention where voltages of opposite phase are applied to the neighboring piezoelectric thin-films 1 through n. In these cases, the thickness of the vibrator portion is set to be half of the resonance wavelength 2 of the first(basic) vibration mode.

The following Table shows the locations of the piezoelectric thin-film layers 1 through 5 arranged according to the above formula, the nodal points given by the simulation shown in FIG. 5, and the absolute difference between these locations, and it is understood that the locations of the piezoelectric thin-films 1 through 5 given by the above formula conform with a very little difference to the nodal points.

TABLE

| Order | Formula | Calculation | Absolute Difference |
|---|---|---|---|
| First order | 5 | 5.4 | 0.4 |
| Second order | 2.5 | 2.43 | 0.07 |
|  | 7.5 | 7.15 | 0.35 |
| Third order | 1.7 | 1.6 | 0.1 |
|  | 5 | 4.52 | 0.48 |
|  | 8.3 | 7.86 | 0.44 |
| Fourth order | 1.25 | 1.25 | 0 |
|  | 3.75 | 3.54 | 0.21 |
|  | 6.25 | 5.91 | 0.34 |
|  | 8.75 | 8.4 | 0.35 |
| Fifth order | 1 | 0.97 | 0.03 |
|  | 3 | 3 | 0 |
|  | 5 | 5.02 | 0.02 |
|  | 7 | 7.02 | 0.02 |
|  | 9 | 9.03 | 0.03 |

Hereinafter, more specific examples of the present invention will be described.

Figure 6:
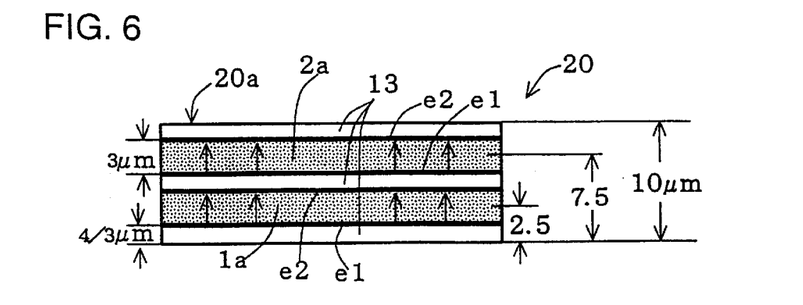
FIG. 6 is a longitudinal sectional view of the construction of the vibrator portion of a piezoelectric resonator according to a comparative example in which electric fields in the same direction are applied to a two piezoelectric thin-film layer construction.
Figure 9:
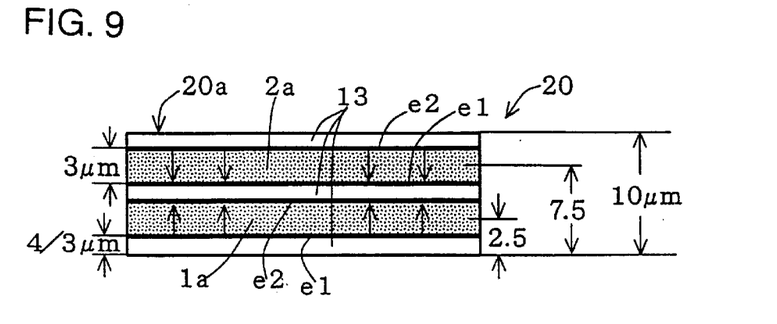
FIG. 9 is a longitudinal sectional view of the construction of the vibrator portion of a piezoelectric resonator according to a first specific example of the present invention, in which electric fields of opposite direction are applied to the two piezoelectric thin-film layers.

FIGS. 6 and 9 show two piezoelectric resonators 20 having the same structure. However, the piezoelectric resonator 20 shown in FIG. 6 is driven so that the adjacent piezoelectric thin film layers are excited with the same phase, thereby constituting a comparative example. The piezoelectric resonator 20 shown in FIG. 9 is driven so that the adjacent piezoelectric thin film layers are excited with opposite in accordance with the preferred embodiments of the present invention.

In both cases, the vibrator portion 20a of this piezoelectric resonator 20 is composed of two layers of piezoelectric thin-films 1a and 2a and three layers of insulating thin films 13 which are alternately laminated to one another. ZnO is used for the piezoelectric thin-films 1a and 2a, and SiO$_2$ is used for the insulating thin films 12. The both of the ZnO layers have an orientation axis in the thickness direction of the piezoelectric vibrator portion.

The thickness of the vibrator portion is 10 μm. The thickness of each of the piezoelectric thin-film layers 1a and 2a is 3 μm. The thickness of each of the insulating thin film layers 13 is 4/3 μm. The first piezoelectric thin-film layer 1a is located at a distance d=10/4 (=2.5) μm from the lower surface according to formula d=t(2m−1)/2n, and the second piezoelectric thin-film layer 2a is located at a distance d=30/4 (=7.5) μm from the lower surface.

Figure 7:
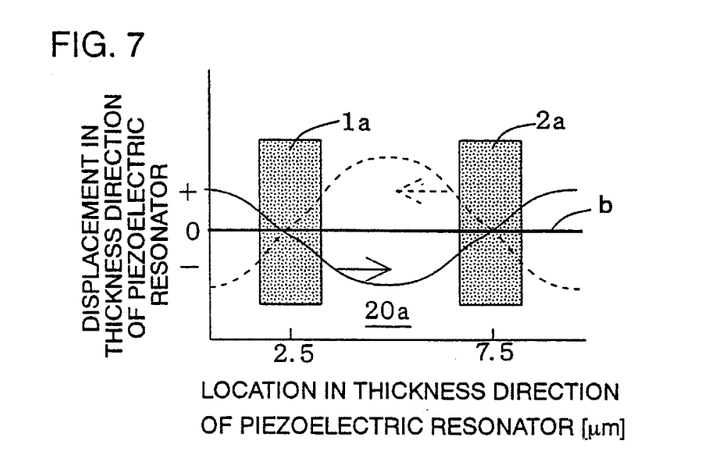
FIG. 7 shows the state of the displacement in the case where voltages of the same phase are applied to the piezoelectric thin-film layers of the piezoelectric resonator shown in FIG. 6.

In the piezoelectric resonator 20 having such a construction, when an electric field of the same direction (same phase) as shown by the arrows is applied to the piezoelectric thin-film layers 1a and 2a, the vibration generated at the piezoelectric thin-film layer 1a is propagated in the direction of the solid arrow toward the piezoelectric thin-film layer 2a along the excitation cosine curve shown by the solid line. Further, the vibration generated at the piezoelectric thin-film layer 2a is propagated in the direction of the broken line arrow toward the piezoelectric thin-film layer 1a along the excitation cosine curve shown in broken line. These two vibrations of opposite phase being propagated on the excitation cosine curves interfere with each other at the destination of the propagation, and at any location in the thickness direction of the vibrator portion 20a the added excitation amplitude becomes zero as shown by a straight line b. In this way the second vibration modes of the piezoelectric thin-film layers 1a and 1b are canceled. Note that, in this case, the first vibration modes are excited by force. Note that, in this case, the piezoelectric resonator vibrates under the fundamental mode.

Figure 8:
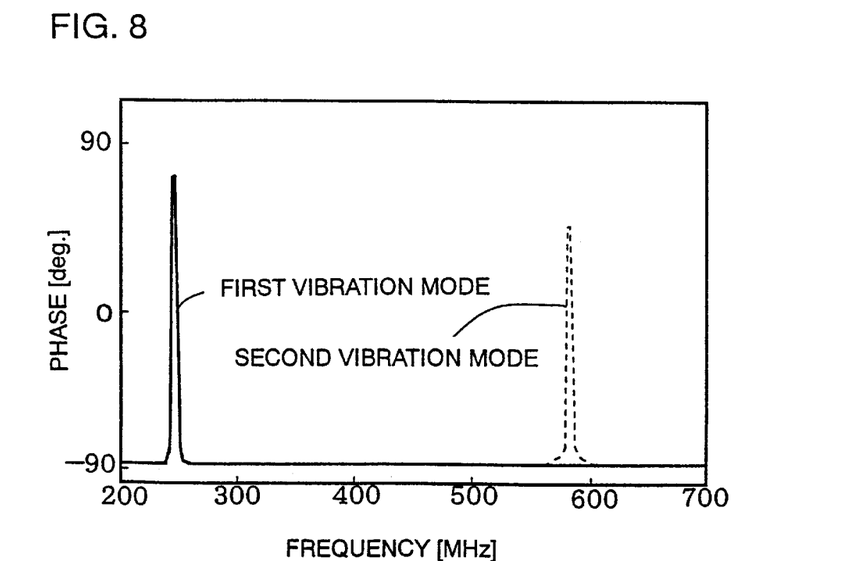
FIG. 8 shows the phase characteristic of the piezoelectric resonator shown in FIG. 6.

A resonance of the fundamental (first) vibration mode occurs around 250 MHz as shown in FIG. 8. Because mechanical vibrations of opposite phase are generated by the piezoelectric thin-film layers 1a and 2a in the second vibration mode, these vibrations cancel each other with the result that no response is brought around the frequency of the second vibration mode.

Figure 10:
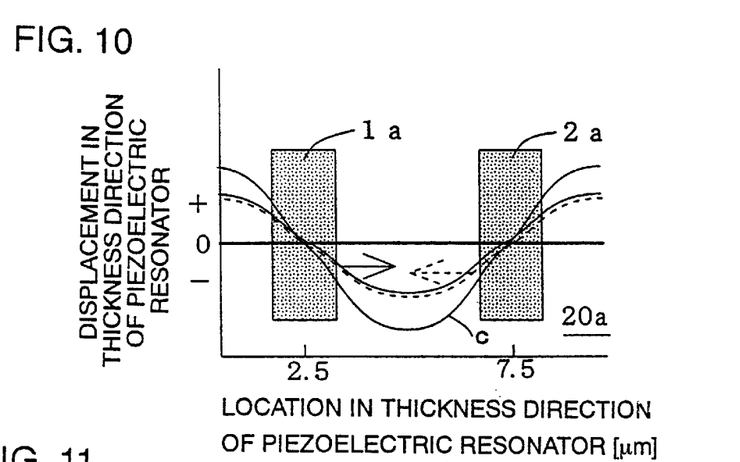
FIG. 10 shows the state of the displacement in the case where voltages of the opposite direction are applied to the piezoelectric thin-films of the piezoelectric resonator shown in FIG. 9.

Next, in a piezoelectric resonator 20 having the same construction as the piezoelectric resonator shown in FIG. 6, electric fields in opposite direction to each other are applied to the neighboring piezoelectric thin-film layers 1a and 2a as shown by the arrows in FIG. 9. In this case, as shown in FIG. 10, the vibration generated by the piezoelectric thin-film layer 1a is propagated in the direction of the piezoelectric thin-film layer 2a on the excitation cosine curve shown by an arrow of solid line, while the vibration generated at the piezoelectric thin-film layer 2a is propagated in the direction of the piezoelectric thin-film layer 1a on the excitation cosine curve shown by an arrow of broken line. These two vibrations of the same phase being propagated on the excitation cosine curve interfere with each other at the destination of propagation, and at any location in the thickness direction of the piezoelectric resonator the vibration amplitudes are added to become double as shown by a cosine curve c. Therefore, when voltages of opposite phase are applied to the piezoelectric thin-film layers 1a and 2a, the second vibration mode is strongly excited. However, in this case, the first vibration modes cancel each other to attenuate.

Figure 11:
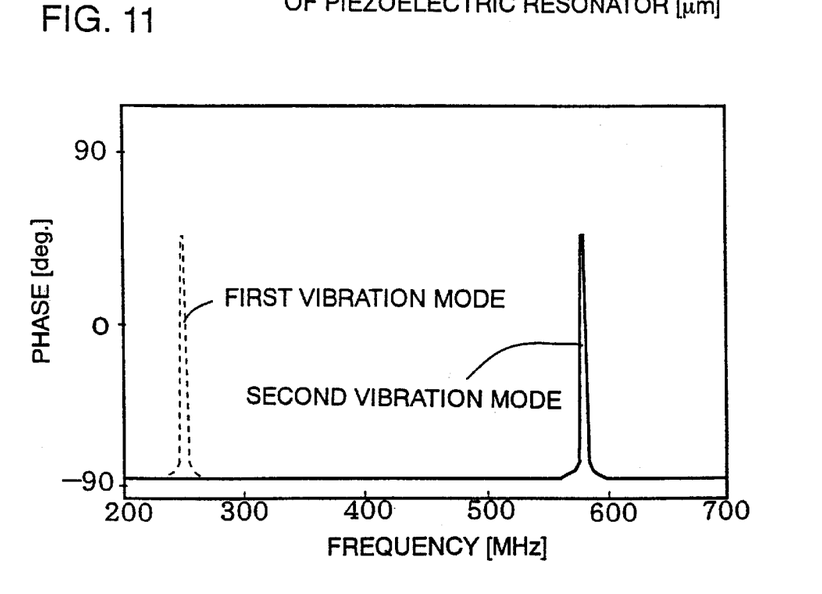
FIG. 11 shows the phase characteristic of the piezoelectric resonator shown in FIG. 9.

As a result, a resonance characteristic as shown in FIG. 11 can be obtained. As shown in the Figure, a resonance based on the second vibration mode occurs around 580 MHz. This resonance occurs because the mechanical vibrations of the piezoelectric thin-film layers 1a and 2a become of the same phase and strengthen each other in the second vibration mode. In contrast, the responses due to the first vibration mode cancel each other to disappear or attenuate.

It is believed that the reason why the second vibration mode of the above 580 MHz does not agree with double the basic (first) vibration mode of 250 MHz is due to a small difference in the velocity of sound of ZnO (6400 m/s) and $SiO_2$ (6000 m/s) and the multilayer construction.

Figure 12:
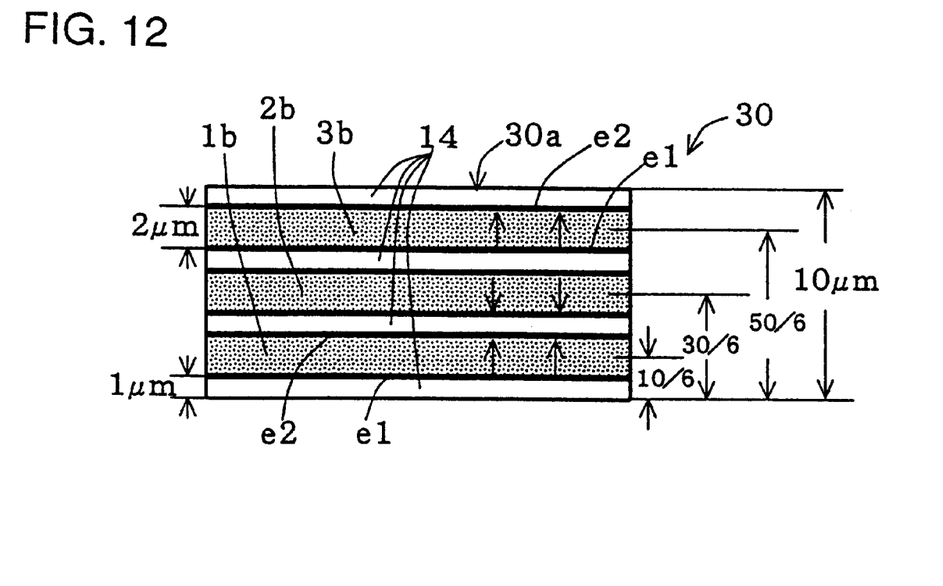
FIG. 12 is a longitudinal sectional view of the construction of the vibrator portion of the piezoelectric resonator according to a second specific example of the present invention, in which electric fields in opposite direction are applied to adjacent piezoelectric thin-film layers of a resonator having a three-layer construction.

Next, a piezoelectric resonator 30 according to a third embodiment of the invention is explained with reference to FIG. 12. The vibrator portion 30a of this piezoelectric resonator 30 is composed of three piezoelectric thin-film layers 1b through 3b and four insulating thin film layers 14 which are alternately laminated to one another. ZnO is used for the piezoelectric thin films of the piezoelectric thin-film layers 1b through 3b, and $SiO_2$ is used for the insulating thin film layers 14. The piezoelectric thin film layers (ZnO) of 1b through 3b have their orientation axis in the thickness direction.

The thickness of the vibrator portion 30a is 10 μm. The thickness of the piezoelectric thin-film layers 1b through 3b are each 2 μm. Each of the insulating thin film layers 14 is 1 μm. The first piezoelectric thin-film layer 1b is located at a distance of 10/6 μm from the lower surface of the vibrator section, according to the formula $[d=t(2m-1)/2n]$, the second the piezoelectric thin-film layer 2b is located at a distance of 30/6 μm from the lower surface of the vibrator section, and the third piezoelectric thin-film layer 3b is located at a distance of 50/6 μm from the lower surface of the vibrator section.

Figure 13:
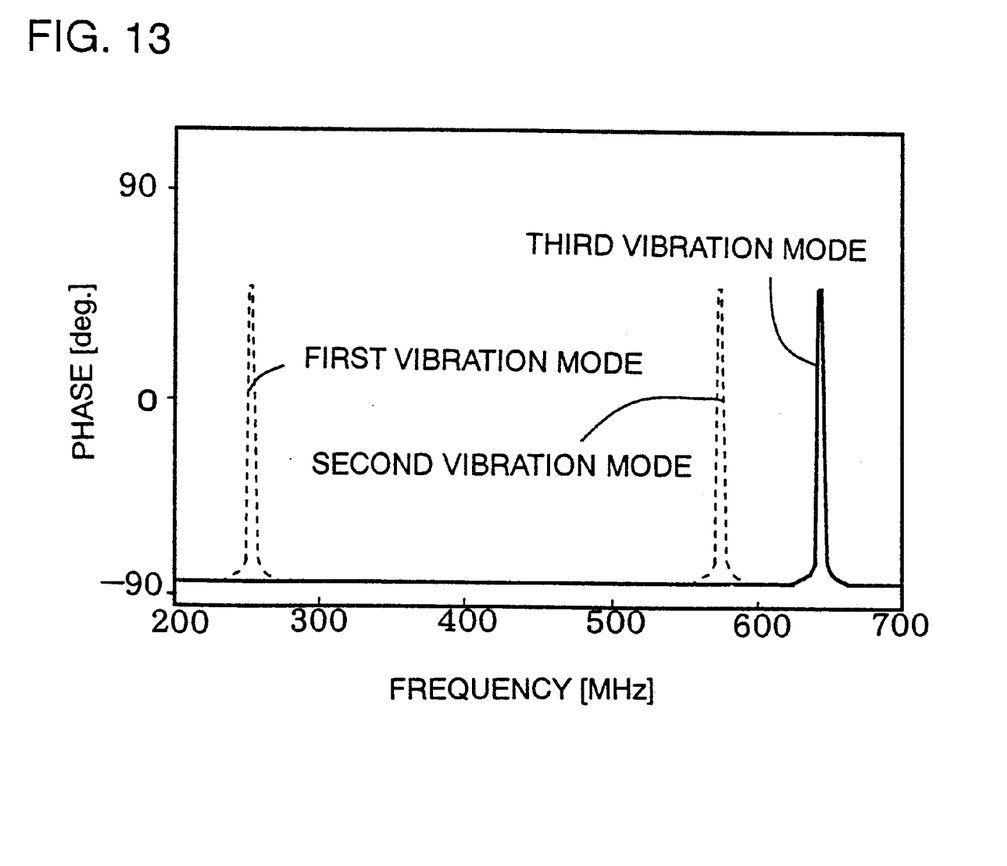
FIG. 13 shows the phase characteristic of the piezoelectric resonator shown in FIG. 12.

In this piezoelectric resonator, when electric fields of opposite phase are applied to the neighboring piezoelectric thin-film layers 1b through 3b, as shown by the arrow, a resonance of the third vibration mode occurs around 650 MHz as shown in FIG. 13. The reason why the strong resonance occurs at the third mode is that because the piezoelectric thin-film layers 1b through 3b are arranged at the nodal points of the vibration in the thickness direction of the third mode and all of the mechanical vibrations of the piezoelectric thin-film layers 1b through 3b are of the same phase at the third mode to strengthen each other. In this third mode the electromechanical coupling coefficient increases and the electrical energy is most efficiently converted into the mechanical energy. In this case, the first vibration modes and second vibration modes cancel each other to disappear or attenuate.

Furthermore, it is considered that the reason why the relationship of an even or odd multiple is not established between the frequency of the above first vibration mode and the frequency of the second vibration mode or third vibration mode is a composite construction of ZnO and $SiO_2$ and their different ratio of film thicknesses and velocity of sound.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric resonator using a thickness extensional vibration mode, the piezoelectric resonator comprising a vibrator portion made up of n layers of piezoelectric thin-film, n being an integer greater than or equal to 2, each of the piezoelectric thin-film layers being separated by a respective insulating thin-film layer, the distance $d_n$ to the center of each of the n piezoelectric thin-film layers from a first side of the vibrator portion, being determined by the formula $$d_n=t(2m-1)/2n$$

wherein t is the thickness of the vibrator portion and m is an integer less than or equal to n.

2. A piezoelectric resonator as claimed in claim 1, wherein each of the piezoelectric thin-film layers comprises a generally planar piezoelectric thin-film having electrodes formed on opposite sides thereof.

3. A piezoelectric resonator as claimed in claim 2, wherein each of the piezoelectric thin-film layers and each of the insulating thin-film layers are generally planar and extend parallel to one another.

4. A piezoelectric resonator as claimed in claim 2, wherein the piezoelectric thin-films and the insulating thin film layers are made up of materials having temperature coefficients of the elastic constant whose sign is opposite to one another.

5. A piezoelectric resonator as claimed in claim 1, wherein adjacent piezoelectric thin-film layers are polarized in the same direction.

6. A piezoelectric resonator as claimed in claim 1, wherein adjacent piezoelectric thin-films are polarized in opposite directions.

7. A piezoelectric resonator as claimed in claim 1, wherein the thickness t is equal to one half of the wave length of the first resonance wavelength of the thickness extension vibration mode.

8. The combination of a piezoelectric resonator and a voltage source, the combination comprising:

a piezoelectric resonator using a thickness extensional vibration mode, the piezoelectric resonator comprising a vibrator portion made up of n layers of piezoelectric thin-film, n being an integer greater than or equal to 2, each of the piezoelectric thin-film layers being separated by a respective insulating thin-film layer; and a voltage source for applying alternating voltages to the piezoelectric resonator in such a manner that the predominant vibration mode excited in the piezoelectric resonator is a higher-order vibration mode.

9. The combination according to claim 8, wherein the alternating voltages are independently applied to each of the piezoelectric thin-film layers.

10. The combination of claim 8, wherein the higher-order vibration mode is the nth vibration mode.

11. The combination of claim 10, wherein the distance $d_n$ to the center of each of the n piezoelectric thin-film layers from a first side of the vibrator portion is determined by the formula $$d_n=t(2m-1)/2n$$

wherein t is the thickness of the vibrator portion and m is an integer less than or equal to n.

12. The combination of claim 11, wherein the thickness t is equal to one half of the wave length of the first resonance wavelength of the thickness extension vibration mode.

13. The combination of claim 11, wherein each of the piezoelectric thin-film layers comprises a generally planar piezoelectric thin-film having electrodes formed on opposite sides thereof.

14. The combination of claim 13 wherein each of the piezoelectric thin-film layers and each of the insulating thin-film layers are generally planar and extend parallel to one another.

15. The combination of claim 14, wherein the piezoelectric thin-films and the insulating thin film layers are made up of materials having temperature coefficients of the elastic constant whose sign is opposite to one another.

16. The combination of claim 15, wherein adjacent piezoelectric thin-film layers are polarized in the same direction and the voltage source applies alternating voltages of the opposite phase to adjacent piezoelectric thin-film layers.

17. The combination of claim 15 wherein adjacent piezoelectric thin-film layers are polarized in opposite directions and the voltage source applies alternating voltages of the same phase to each of the piezoelectric thin-film layers.

18. The combination of claim 15, wherein the voltage source applies alternating voltages to the piezoelectric thin-film layers in such a manner that vibrations of opposite phase are induced in adjacent piezoelectric thin-film layers.

19. The combination of claim 8, wherein adjacent piezoelectric thin-film layers are polarized in the same direction and the voltage source applies alternating voltages of the opposite phase to adjacent piezoelectric thin-film layers.

20. The combination of claim 8 wherein adjacent piezoelectric thin-film layers are polarized in opposite directions and the voltage source applies alternating voltages of the same phase to each of the piezoelectric thin-film layers.

21. The combination of claim 8, wherein the voltage source applies alternating voltages to the piezoelectric thin-film layers in such a manner that vibrations of opposite phase are induced in adjacent piezoelectric thin-film layers.

22. A method for exciting a piezoelectric resonator in a thickness extensional vibration mode, the piezoelectric resonator comprising a vibrator portion made up of n layers of piezoelectric thin-film, n being an integer greater or equal to 2, each of the piezoelectric thin-film layers being separated by a respective insulating thin-film layer, the method comprising:

applying alternating voltages to the piezoelectric thin film layers in such a manner that the predominant vibration mode excited in the piezoelectric resonator is a higher-order vibration mode.

23. The method of claim 22, wherein the alternating voltages are independently applied to each of the piezoelectric thin-film layers.

24. The method of claim 22, wherein the higher-order vibration mode is the nth vibration mode.

25. The method of claim 24, wherein the distance $d_n$ to the center of each of the n piezoelectric thin-film layers from a first side of the vibrator portion is determined by the formula $$d_n = t(2m-1)/2n$$

wherein t is the thickness of the vibrator portion and m is an integer less than or equal to n.

26. The method of claim 25, wherein each of the piezoelectric thin-film layers comprises a generally planar piezoelectric thin-film having electrodes formed on opposite sides thereof.

27. The method of claim 26 wherein each of the piezoelectric thin-film layers and each of the insulating thin-film layers are generally planar and extend parallel to one another.

28. The method of claim 27, wherein the piezoelectric thin-films and the insulating thin film layers are made up of materials having temperature coefficients of the elastic constant whose sign is opposite to one another.

29. The method of claim 28, wherein adjacent piezoelectric thin-film layers are polarized in the same direction and alternating voltages of the opposite phase are applied to adjacent piezoelectric thin-film layers.

30. The method of claim 28, wherein adjacent piezoelectric thin-film layers are polarized in opposite directions and alternating voltages of the same phase are applied to each of the piezoelectric thin-film layers.

31. The method of claim 28, wherein alternating voltages are applied to the piezoelectric thin-film layers in such a manner that vibrations of opposite phase are induced in adjacent piezoelectric thin-film layers.

32. The method of claim 25, wherein the thickness t is equal to one half of the wave length of the first resonance wavelength of the thickness extension vibration mode.

33. The method of claim 22, wherein adjacent piezoelectric thin-film layers are polarized in the same direction and alternating voltages of the opposite phase are applied to adjacent piezoelectric thin-film layers.

34. The method of claim 22, wherein adjacent piezoelectric thin-film layers are polarized in opposite directions and alternating voltages of the same phase are applied to each of the piezoelectric thin-film layers.

35. The method of claim 22, wherein alternating voltages are applied to the piezoelectric thin-film layers in such a manner that vibrations of opposite phase are induced in adjacent piezoelectric thin-film layers.

* * * * *